United States Patent [19]

Kalthoff et al.

[11] Patent Number: 5,367,302
[45] Date of Patent: Nov. 22, 1994

[54] ISOLATING A CDAC ARRAY IN A CURRENT INTEGRATING ADC

[75] Inventors: Timothy V. Kalthoff; Gregory S. Waterfall, both of Tucson, Ariz.

[73] Assignee: Burr-Brown Corporation, Tucson, Ariz.

[21] Appl. No.: 111,113

[22] Filed: Aug. 24, 1993

[51] Int. Cl.$^5$ .............................................. H03M 1/50
[52] U.S. Cl. .................................... 341/166; 341/163
[58] Field of Search ............... 341/150, 152, 163, 166, 341/167

[56] References Cited

U.S. PATENT DOCUMENTS

| | | | |
|---|---|---|---|
| 4,707,680 | 11/1987 | Sparrowhawk | 341/166 |
| 4,764,750 | 8/1988 | Kawada | 340/347 |
| 4,764,753 | 8/1988 | Yukawa | 340/347 |
| 4,768,019 | 8/1988 | Linder | 341/166 |
| 4,876,544 | 10/1989 | Kuraishi | 341/166 |
| 4,888,587 | 12/1989 | Kuraishi | 341/122 |
| 5,103,230 | 4/1992 | Kalthoff et al. | 341/166 |
| 5,117,227 | 5/1992 | Goeke | 341/166 |

OTHER PUBLICATIONS

"A Two-Stage Weighted Capacitor Network for D/A-A/D Conversion", by Y. S. Yee, L. M. Terman, and L. G. Heller, IEEE Journal of Solid-State Circuits, vol. SC-14, No. 4, Aug., 1979.

Primary Examiner—Marc S. Hoff
Attorney, Agent, or Firm—Cahill, Sutton & Thomas

[57] ABSTRACT

A current integrating analog-to-digital converter includes a comparator having a non-inverting input coupled to receive a ground voltage and an inverting input coupled to an input conductor, with an input current flowing through the input conductor, an integrating capacitor having a first terminal coupled by an isolation switch to the input conductor. A reset circuit is coupled to the integrating capacitor and is operative to reset the integrating capacitor before each integrating cycle. A digital-to-analog converter, which may be a CDAC, has an output coupled to a second terminal of the integrating capacitor, which may constitute the capacitors of the CDAC. An input of a tracking circuit is coupled to an output of the comparator to produce digital signals on digital inputs of the digital-to-analog converter to maintain the input of the comparator close to a virtual ground voltage, a digital signal on the inputs of the digital-to-analog converter representing the integral of the input current. The isolation switch opens during transients occurring on a charge summing conductor during digital-to-analog converter update and reset operations. An internal reset switch is coupled between a reference conductor and the first level. An external switch is coupled between ground and the input conductor.

18 Claims, 3 Drawing Sheets

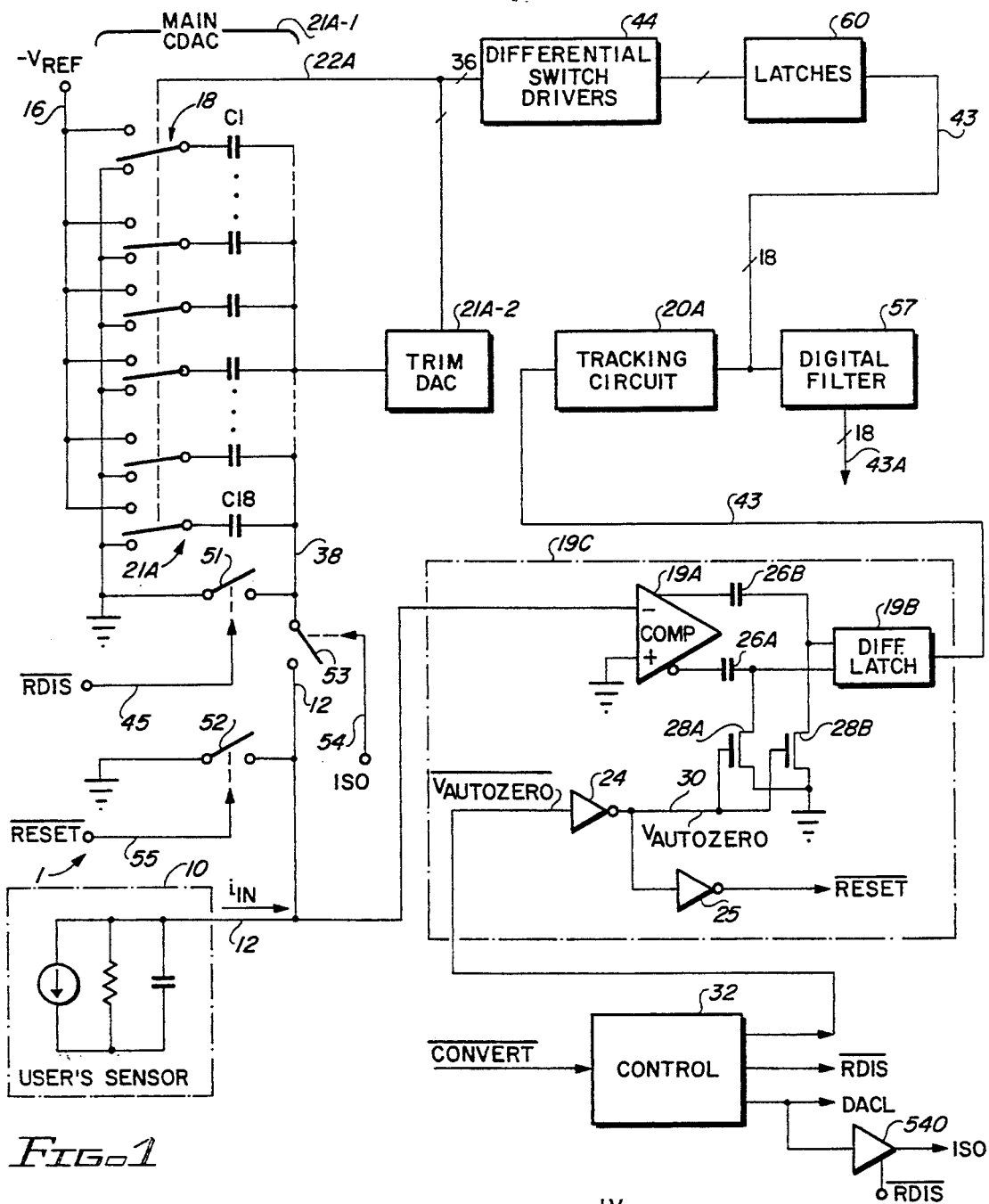
_FIG. 1_
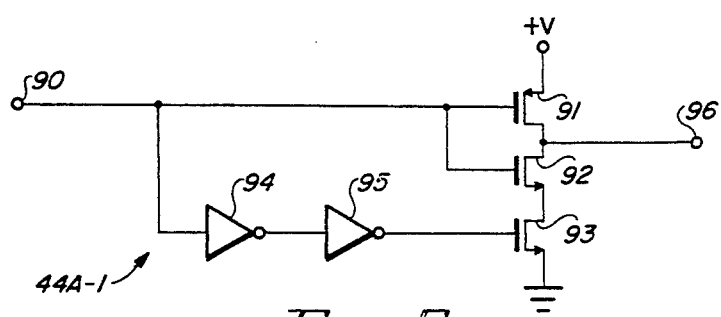
_FIG. 3_

ISOLATING A CDAC ARRAY IN A CURRENT INTEGRATING ADC

BACKGROUND OF THE INVENTION

The invention relates to isolating an internal CDAC in an analog-to-digital converter (ADC) of the kind disclosed in commonly assigned U.S. Pat. No. 5,103,230 during CDAC integrating capacitor reset and update operations to avoid damaging an external analog sensor connected to the ADC by internal switching transients and to avoid conversion inaccuracies due to charge loss caused by rectification of the switching transients, leakage through the sensor, and/or MOS threshold voltage shifts in the input stage of the comparator of the ADC.

U.S. Pat. No. 5,103,230 and the article "A Two-Stage Weighted Capacitor Network for D/A-A/D Conversion", IEEE Journal of Solid-State Circuits, vol. SC-14, No. 4, August, 1979, page 778 constitute the closest known prior art. Referring to FIG. 3 of U.S. Pat. No. 5,103,230, the charge summing conductor 38 of eighteen bit CDAC (Capacitive Digital-to-Analog converter) 21A is coupled by a resistor 37 to a user's sensor 10 and a comparator 19A. A problem with this use of resistor 37 is that during "reset" and "update" of CDAC section 21A, eighteen various digital bit signals are produced by tracking logic 20A and applied to the eighteen various switches S1–S18 to selectively switch binarily weighted capacitors C1–C18 between ground and $-V_{REF}$. These operations cause large voltage transients to appear on charge summing conductor 38.

Waveform $V_{38}$ in FIG. 3 of the present application illustrates such voltage transients 42 and 62, which can be two or three volts in amplitude. It is very undesirable for voltage transients 42 and 62 to appear across the user's sensor 10, which may include a voltage-sensitive device such as a photodiode that can be destroyed by such a two or three volt transient 42. The time constant of a large external capacitance associated with the input conductor and the user's sensor 10 and the resistance of resistor 37 in FIG. 3 of U.S. Pat. No. 5,103,230 can result in an unacceptably long settling time for that voltage transient. Furthermore, the accuracy of the current integrating ADC 1 of U.S. Pat. No. 5,103,230 depends upon avoiding loss of any charge supplied by $i_{IN}$ while the CDAC 21A-1 is being "updated". The user's sensor 10 is likely to rectify a large voltage transient on charge summing conductor 38 if it is not well isolated from input conductor 12. This is especially true if sensor 10 includes a photodiode that is forward biased by the voltage transient 42 or 62. Such rectification causes loss of charge, and hence causes inaccuracy in the analog-to-digital conversion being performed. Furthermore, the voltage transients on conductor 38 also cause small temporary (several hundred milliseconds in duration) shifts in the threshold voltage of the input MOSFETs in the input stage of comparator 19A in FIG. 3 of U.S. Pat. No. 5,103,230 which can greatly decrease the accuracy of the current integrating ADC.

The problems associated with the above voltage transients on the charge summing conductor prevent the current integrating amplifier of U.S. Pat. No. 5,103,230 from achieving the accuracy now desired in the market place for such products.

Thus, there is an unmet need for an improved current integrating analog-to-digital converter of the general type disclosed in U.S. Pat. No. 5,103,230 that avoids the various problems associated with voltage transients produced on the charge summing conductor during CDAC resetting and updating operations.

SUMMARY OF THE INVENTION

Accordingly, it is an object of the invention to provide a circuit and method which avoid damage to sensors connected to an analog input conductor of a current integrating analog-to-digital converter including an internal CDAC.

It is another object of the invention to provide a circuit and method for avoiding inaccuracies caused by charge loss resulting from "parasitic" rectification of voltage transient signals on a charge summing conductor on an internal CDAC in a current integrating analog-to-digital converter of the general type shown in U.S. Pat. No. 5,103,230.

It is another object of the invention to provide a circuit and method for avoiding inaccuracies caused by charge loss due to leakage currents in an external sensor caused by voltage transients on a charge summing conductor of an internal DAC in a current integrating analog-to-digital converter of the general type shown in U.S. Pat. No. 5,103,230.

It is another object of the invention to avoid conversion inaccuracy due to MOS threshold voltage shifts in the input stage of the comparator of U.S. Pat. No. 5,103,230.

It is another object of the invention to avoid long transient voltage setting times caused by sensor capacitance in a current integrating analog-to-digital converter of the general type disclosed in U.S. Pat. No. 5,103,230.

It is another object of the invention to avoid conversion errors caused by unbalanced charge injection into the analog input conductor of a current integrating analog-to-digital converter due to switching of MOSFETs.

Briefly described, and in accordance with one embodiment thereof, the invention provides a current integrating analog-to-digital converter including a comparator having a non-inverting input coupled to a ground voltage and an inverting input coupled to an input conductor conducting an input current, and an integrating capacitor having a first terminal coupled to the input conductor. A reset circuit is coupled to the integrating capacitor and is operative to reset the integrating capacitor before each integrating cycle. A digital-to-analog converter has an output coupled to a second terminal of the integrating capacitor. An input of a tracking circuit is coupled to an output of the comparator to produce digital signals on digital inputs of the digital-to-analog converter so as to maintain the input of the comparator close to a virtual ground voltage, whereby a digital signal on the inputs of the digital-to-analog converter represents the integral of the input current. An isolation switch is coupled between the first terminal and the input conductor. A control circuit opens the isolation switch during resetting of the integrating capacitor. A circuit similar in operation to a one-shot opens the isolation switch when the CDAC is being updated. In the described embodiment, a CDAC includes a charge summing conductor coupled by an isolation switch to the input conductor. The CDAC functions as an integrating capacitor having a terminal coupled to the input conductor. First and second isolation switches couple the charge summing conductor and the analog input conductor to ground during a reset operation. The isolation switch is opened during both the reset operation and during tracking operations of the CDAC for a long enough time to allow settling of voltage transients occurring on the charge summing conductor as a result of CDAC reset and update operations.

BRIEF DESCRIPTION OF THE DRAWINGS

FIG. 1 is a schematic diagram illustrating the isolating circuitry of the present invention in a current integrating analog-to-digital converter implemented using an internal CDAC.

FIG. 5 is a circuit diagram illustrating an implementation of inverter 44A-1 of FIG. 2.

DETAILED DESCRIPTION OF THE PREFERRED EMBODIMENTS

Figure 2:
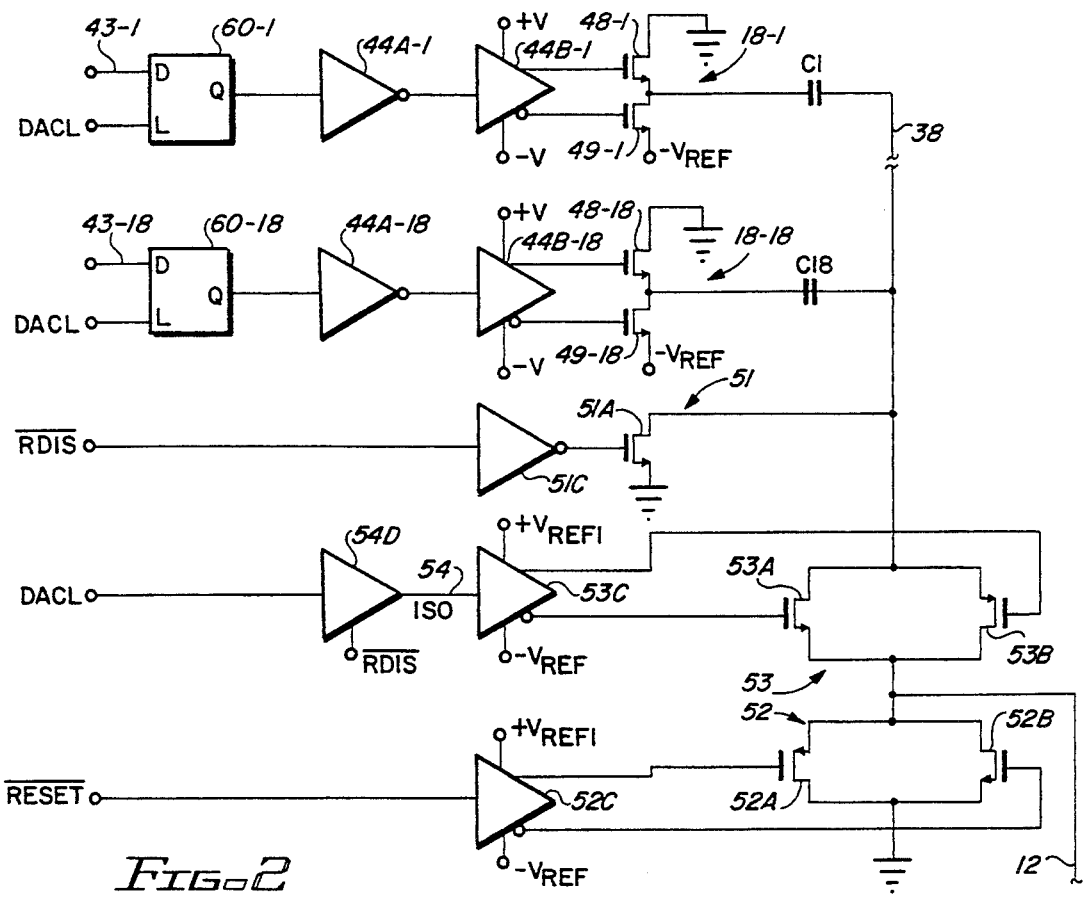
FIG. 2 is a schematic diagram illustrating the isolation technique in FIG. 1 using MOS transistors.

Referring to FIG. 1, current integrating analog-to-digital converter 1 includes an analog input current 12 connected to an external sensor device 10. Analog input conductor 12 is connected to the inverting input of comparator 19A, the non-inverting input of which is connected to ground.

Analog input conductor 12 also is connected to one current carrying terminal of external reset switch 52, the other current carrying terminal which is connected to ground. The control terminal of external reset switch 52 is connected by conductor 55 to the signal cycle $\overline{RESET}$, shown in the timing diagram of FIG. 3.

Analog input conductor 12 also is connected to one current carrying terminal of isolation switch 53, the other current carrying terminal of which is connected to charge summing conductor 38 of CDAC array 21A. (Note that a more detailed description of a very similar current integrating analog-to-digital converter is included in commonly assigned U. S. Pat. No. 5,103,230, by Kalthoff et al., issued Apr. 7, 1992, and incorporated herein by reference. The details of operation of the current integrating ADC to produce a digital output that accurately represents the sensor current $i_{IN}$ are described in U.S. Pat. No. 5,103,230, but are not required to understand the gist of the present invention. Commonly assigned U. S. Pat. No. 4,940,981 issued Jul. 10, 1990 to Naylor et al. and commonly assigned U.S. Pat. No. 4,947,169 issued Aug. 7, 1990 to Smith et al. also are incorporated herein by reference for their detailed disclosure of CDACs.) The control electrode of isolation switch 53 is connected by conductor 54 to apply the signal ISO, shown in the timing diagram of FIG. 3. Charge summing conductor 38 is connected to one current carrying terminal of internal reset switch 51, the other current carrying terminal of which is connected to ground. The control terminal of internal reset switch 51 is connected to receive the $\overline{RDIS}$ signal, shown in the timing diagram of FIG. 3.

As those skilled in the art know, and as explained in more detail in U.S. Pat. No. 5,103,230, CDAC 21A includes "a main CDAC" section 21A-1 and a "trim DAC" section 21A-2 which balances parasitic charge injection caused by switching in the main CDAC 21A-1. The various binarily weighted capacitors C1–C18 of main CDAC 21A-1 each have one terminal connected to charge summing conductor 38 and another terminal connected to a current carrying terminal of a corresponding one of switches 18, the control electrodes of which are connected, respectively, to various conductors of 36-conductor bus 22A to selectively switch the left terminals of capacitors C1–C18 either to the voltage $-V_{REF}$ on conductor 16 or to ground during a CDAC update. (CDAC resetting and updating operation is well understood by those skilled in the art, and is explained in more detail in above-mentioned U.S. Pat. Nos. 5,103,230, 4,940,981 and 4 947,169) During a CDAC "reset" the left terminals of comparators C1...C18 are connected to ground by switches 18.

The 36 conductors of bus 22A are connected to outputs of 18 corresponding differential switch drivers in block 44. The inputs of the differential switch drivers in block 44 are connected to outputs of corresponding latches in block 60, the inputs of which are coupled by eighteen conductors 43 to outputs of tracking circuit 20A (one embodiment of which is described in U.S. Pat. No. 5,103,230). Conductors 43 also are connected to inputs of digital filter 57. Digital filter 57 performs a low pass filtering operation on the eighteen bits of conductors 43, producing a low noise digital output representing the value of $i_{IN}$.

During an integration cycle reset operation, switches 51, 52, and 53 operate so as to isolate the reset voltage transient 62 and to provide optimal auto-zeroing of comparator 19. During the time that isolation switch 53 is open and reset switches 51 and 52 are closed, the inverting input of comparator 19A is coupled to ground. During the last half of the reset cycle, switches 52 and 53 are closed and switch 51 is open. Any input offset voltage characteristic of comparator 19A and switch 52 is multiplied by the gain of comparator 19A and stored as a difference between the voltages stored on capacitors 26A and 26B, because the autozero signal $V_{AUTOZERO}$ electrically grounds the lower terminals of autozero capacitors 26A and 26B.

Comparator 19A has an inverting output connected to one terminal of an auto-zeroing capacitor 26A, the other terminal of which is connected to the drain electrode of an N-channel MOSFET 28A, the source of which is connected to ground. Comparator 19A has a non-inverting output connected to one terminal of auto-zeroing capacitor 26B, the other terminal of which is connected to the drain electrode of N-channel MOSFET 28B, the source electrode of which is connected to ground. The gate electrodes of MOSFETs 28A and 28B are connected by conductor 30 to a signal $V_{AUTOZERO}$, shown in the timing diagram of FIG. 3. The drain electrodes of MOSFETs 28A and 28B are connected to inputs of a differential latch 19B, the output of which is connected to an input of tracking circuit 20A. The entire circuit 19C can be thought of as a latching comparator.

During an integration cycle reset, the configuration of switches 51, 52 and 53 permits use of the auto-zeroing technique described above, which is a significant advantage because it avoids conversion errors due to normally occurring input offset voltage errors in comparator 19A and ensures auto-zeroing to the voltage on conductor 12.

During tracking operation (subsequently explained), isolation switch 53 is closed and reset switches 51 and 52 are open, and tracking circuit 20A generates digital levels for each of the eighteen bits of main CDAC 21A and stores them in latches 60. Latches 60 then apply the digital levels to differential switch drivers 44, which then apply them to the various switches 18 for the next CDAC update cycle.

The signals DACL, $\overline{RDIS}$, and $V_{AUTOZERO}$ are generated by control circuit 32 in response to an input conversion command signal CONVERT. CMOS inverter 24 has its input connected to receive $V_{AUTOZERO}$ and produces the signal AUTOZERO on conductor 30. CMOS inverter 25 has its input connected to conductor 30 and produces the signal $\overline{RESE T}$ on its output. These signals all are shown in the timing diagram of FIG. 3. Control circuit 32 can be an ordinary "state machine" which can be easily implemented by one skilled in the art having the information shown in the timing diagram of FIG. 3.

FIG. 2 illustrates in more detail the configuration of the latch circuits in block 60 and the differential switch driver circuits in block 44. The individual latch circuits in block 60 (FIG. 1) are conventional D-type latches 60-1...60-18, each enabled by the signal DACL (DAC Latch). The D input of each of latches 60-1...60-18 is connected to a respective one of conductors 43-1...43-18 which constitute bus 43. The Q outputs of the D-type latches are connected to inputs of inverters 44A-1...44A-18. (A circuit schematic diagram of these inverters is shown in FIG. 5, subsequently described.) The outputs of inverters 44A-1...44A-18 are connected to the inputs of differential switch driver circuits 44B-1. ..44B-18, each of which produces an inverting output and a non-inverting output. Such differential switch drivers are of conventional design and can be easily implemented by one skilled in the art. They operate such that during each change of the level of the input, both of the outputs are at a logical "0" for a short period, so there is no overlapping "on" time for MOSFETs 48-1 and 48-9, to thereby avoid current spikes from ground to $-V_{REF}$.

Each of switches 18-1...18-18 is implemented as shown. For example, switch 18 includes an N-channel MOSFET 18-1 having its gate electrode connected to the non-inverted output of differential switch driver 44B-1, its drain connected to ground, and its source connected to the drain of MOSFET 49-1 and to the left terminal of CDAC capacitor C1. The inverted output of differential switch driver 44B-1 is connected to the gate of MOSFET 49-1, the source of which is connected to $-V_{REF}$.

Internal reset switch 51 includes N-channel MOSFET 51A having its drain connected to charge summing conductor 38, its source connected to ground, and its gate connected to the output of CMOS inverter 51C, the input of which is connected to $\overline{RDIS}$. Isolation switch 53 includes N-channel MOSFET 53A and P-channel MOSFET 53B. The source of MOSFET 53B and the drain of MOSFET 53A are connected to charge summing conductor 38. The gate of MOSFET 53B is connected to the non-inverted output of differential switch driver 53C. The gate of MOSFET 53A is connected to the inverted output of differential switch driver 53C. The differential switch driver 53C is connected between power supply voltages of $-VREF$ and $+V_{REF1}$. The source of MOSFET 53A and the drain of MOSFET 53B are connected to input conductor 12.

External reset switch 52 includes P-channel MOSFET 52A arid N-channel MOSFET 52B. The source of MOSFET 52A and the drain of MOSFET 52B are connected to input conductor 12. The gate of MOSFET 52A is connected to the non-inverted output of differential switch driver 52C, and the gate of MOSFET 52B is connected to the inverted output of differential switch driver 52C. The drain of MOSFET 52A and the source of MOSFET 52B are connected to ground. The input of differential switch driver 52C is connected to $\overline{RESET}$. The reference voltage $+V_{REF1}$ can be precisely adjusted or trimmed during manufacture to balance the charge injection into and out of analog input conductor 12 as the inverted and non-inverted outputs of differential drive 52C undergo complementary transitions.

Figure 3:
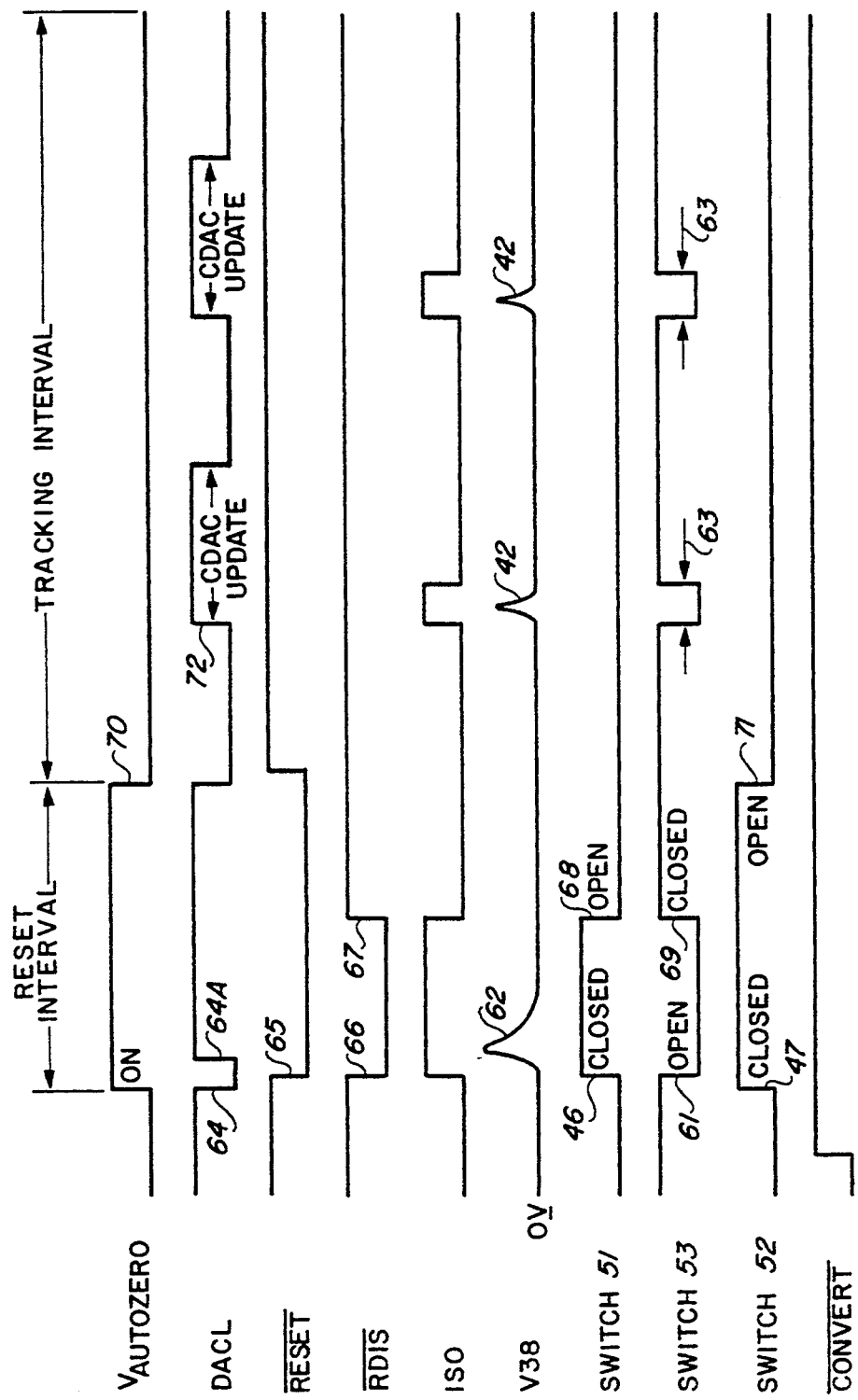
FIG. 3 is a timing diagram useful in describing the operation of the circuit of FIG. 1.

The circuitry shown in FIGS. 1 and 2 and the waveforms shown in FIG. 3 clarify that the various switches 18 are operative during a CDAC update in such a manner as to cause positive-going voltage transients to occur on charge summing conductor 38 before the occurrence of negative-going voltage transients. This is desirable in order to avoid the possibility of forward biasing source-to-channel PN junctions of the N-channel isolation MOSFET 53 and reset MOSFET 51, and to avoid turning on MOSFET 51A, which would occur if its drain voltage falls more than a threshold voltage below its gate voltage, which is at ground except during a reset cycle. Such forward biasing would result in loss of charge from charge summing conductor 38, causing analog-to-digital conversion inaccuracy.

To this end, the present invention utilizes the differential switch drivers in block 44 of FIG. 1, the inputs of which are driven by latches in block 60 of FIG. 1. The differential switch drivers in block 44 operate such that the various switches 18 connect various capacitors C1–C18 to ground before connecting others of capacitors C1–C18 to $-V_{REF}$. Consequently, all of the positive-going charge contribution to charge summing conductor 38 occurs before the negative charge contribution during each CDAC reset or update operation. This ensures that none of the parasitic source-to-channel PN junctions of any N-channel MOSFETs will become forward biased by a negative-going voltage transition of charge summing conductor 38 and that the net voltage transients 42 and 62 always will be positive relative to ground. The gate of the N-channel reset MOSFET 51A is at ground, so the voltage transients 42 and 62 can not turn MOSFET 51A on by driving its drain below ground.

To achieve this result, the inverters such as 44A-1 through 44A-18 of FIG. 2 are designed as shown in FIG. 5 so that the negative-going transitions on the outputs thereof are delayed from the positive-going transitions. In FIG. 5 inverter 44A has an input 90 which is connected to the Q output of LATCH 60-1 (FIG. 2). Input 90 is connected to the gate of P-channel MOSFET 91 and N-channel MOSFET 92 and also to the input of CMOS inverter 94. The source and drain of MOSFET 91 are connected to $+V$ and output terminal 96, respectively. Output terminal 96 is connected to the input of differential switch driver 44-B-1 (FIG. 2) and to the drain of MOSFET 92, the source of which is connected to the drain of N-channel MOSFET 93. The source of MOSFET 93 is connected to ground, and its gate is connected to the output of CMOS inverter 95, the input of which is connected to the output of CMOS inverter 94.

A falling or negative-going signal on conductor 90 turns P-channel MOSFET 91 on and N-channel MOSFET 92 off, causing the voltage on conductor 96 to immediately rise from ground to $+V$, with no appreciable delay. A rising or positive-going signal on conductor 90 turns P-channel MOSFET 91 off and N-channel MOSFET 92 on. However, while that rising signal on conductor 90 is being delayed through CMOS inverters 94 and 95, the gate voltage of N-channel MOSFET 93 remains at ground. That is, MOSFET 93 does not immediately turn on, and the output voltage on conductor 96 does not fall from +V to ground in response to the rising signal on conductor 90 until after that signal has propagated through the delay of CMOS inverters 94 and 95. Consequently, the positive contribution to voltage transients 42 and 62 (FIG. 3) always precedes the negative contribution thereto, and the possibility of voltage transients on charge summing conductor 38 is avoided.

During normal "tracking" operation, reset switches 51 and 52 are off, or open. Isolation switch 53 is closed except during voltage transients 42 which are produced on charge summing conductor 38 at the beginning of each CDAC update cycle.

At the end of each complete integration or tracking cycle, (each of which includes a user-controlled number of CDAC update operations so as to cause tracking circuit 20A to cause CDAC 21A to satisfactorily maintain input conductor 12 near the virtual ground voltage established by the non-inverting input of comparator 19A) there is a reset period. During such a reset period, switch 53 opens, and switches 51 and 52 close, as indicated by 61, 46, and 47, respectively, in FIG. 3. Then the output latches of tracking circuit 20A are reset, directing switches 18 to a reset configuration, producing voltage transient 62. Switch 51 stays closed for the first half of the reset cycle. Then switch 51 opens as indicated by 68 and isolation switch 53 closes as indicated by 69, connecting charge summing conductor 38 to external input conductor 12. External reset switch 52 remains closed until the end of the reset cycle and then opens immediately after the autozeroing operation is completed.

The timing diagram of FIG. 3 shows the various waveforms of signals shown in FIG. 1 for the reset operation and the tracking operation for a typical analog-to-digital conversion. As indicated in the timing diagram of FIG. 3, the waveforms SWITCH51, SWITCH52, AND SWITCH53 indicate whether each of switches 51, 52, and 53 is open or closed during each phase of the CDAC reset and tracking operations. A high level indicates the corresponding switch is closed and a low level indicates that it is open.

The reset interval begins with DACL going to a "zero" level, as indicated by 64. $\overline{\text{RESET}}$ goes to a "0" level at the beginning of the reset interval, as indicated by 65. This causes switch 52 to be closed, as indicated by 47, and causes a reset in the output latches of tracking circuit 20A. Then, $\overline{\text{RDIS}}$ undergoes a transition 66 from a "1" to a "0" level, closing internal reset switch 51 as indicated by 46, and also opens switch 53 as indicated by 61. DACL goes to "1" level, as indicated by 64A, and passes the reset word to the switch drivers in block 44, causing voltage transient 62. At that time, the closed internal reset switch 51 drives conductor 38 to zero volts, dissipating the voltage transient 62 shown in FIG. 3. Since isolation switch 53 is open at that time, the voltage transient 62 does not appear on analog input conductor 12 or on external sensor 10.

It should be understood that the positive-going transition 64A of DACL causes voltage transient 62 on charge summing conductor 38 by switching the left terminal of each of capacitors C1...C18, which all may be at $-V_{REF}$, to ground. Since internal reset switch 51 then is closed by transition 66 of $\overline{\text{RDIS}}$, most or all of voltage transient 62 is internally absorbed.

When RDIS goes from a "0" to a "1" as indicated by 67, internal reset switch 51 opens as indicated by 68 and isolation switch 53 closes as indicated by 69, reconnecting charge summing conductor 38 to analog input conductor 12. Any residual voltage remaining on charge summing conductor 38 then is discharged to ground through external reset switch 52, which continues to be maintained closed by the "0" evel of $\overline{\text{RESET}}$.

It should be understood that $\overline{\text{RESET}}$ is a single-inverter-delayed version of the signal that drives switches 28 of comparator 19A. The closing of external reset switch 52 is associated with the input of comparator 19A so that the autozeroing operation is performed while switch 52 is closed. After the autozeroing operation is complete as indicated by 70, external reset switch 52 opens as indicated by 71. This arrangement is provided to ensure that the autozeroing technique can be used in order to avoid conversion inaccuracy due to input offset voltage typically associated with the input stage of comparator 19A. In addition, this timing arrangement ensures that the compensation achieved by the autozeroing operation occurs while switch 52 is closed. This avoids errors that might be caused by switching of switch 52.

The tracking interval indicated in FIG. 3 begins at the end of the reset interval. During the tracking interval, when DACL goes from a "0" to a "1" as indicated by 72 at the beginning of a CDAC update operation, a voltage transient 42 is produced on charge summing conductor 38. To prevent voltage transient 42 from appearing on analog input conductor 12, isolation switch 53 is opened for a short duration 63, as indicated by numeral 63.

During the tracking interval, reset switches 51 and 52 are both open. When the DACL signal arrives at the inputs of the latches 60-1...60-18 during each CDAC update of the tracking interval, the DACL signal also arrives at the input of enabled buffer/delay circuit 54D (FIG. 2) and causes isolation switch 53 to open. A delay is produced by circuit 54D having a duration indicated by numerals 63 of the waveform for isolation switch 53. The delay 63 is initiated by the rising edges of DACL during the tracking interval, and is produced by circuitry similar to a one-shot circuit. This causes the open intervals 63 of isolation switch 53 to coincide with the voltage transients 42 on charge summing conductor 38 caused by operation of switches 18-1...18-18 at the beginning of each CDAC update operation.

Figure 4:
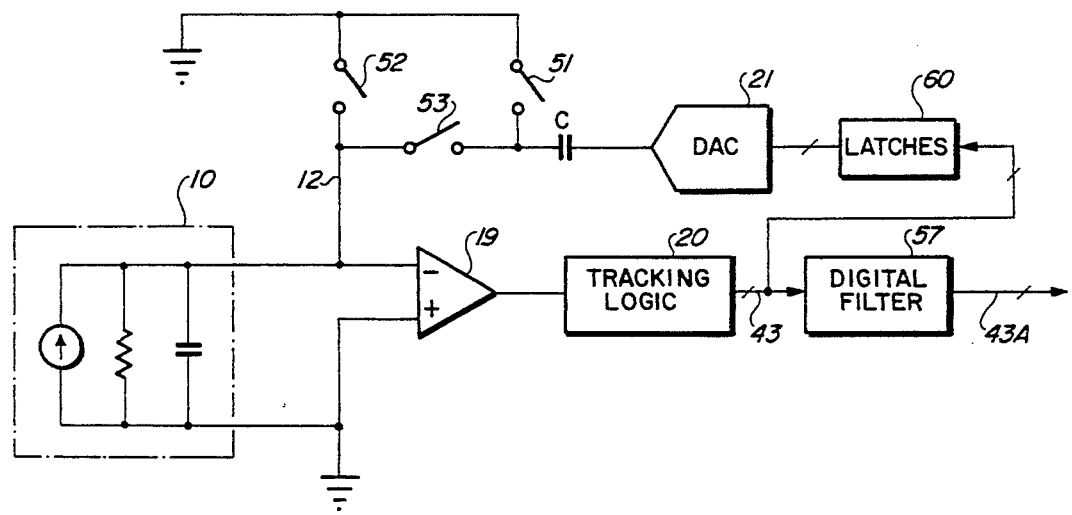
FIG. 4 is a schematic diagram illustrating another embodiment of the invention.

FIG. 4 illustrates how isolation switch 53 and reset switches 51 and 52 can be incorporated into an embodiment of the invention similar to that shown in FIG. 2 of U.S. Pat. No. 5,103,230, in which integrating capacitor C is a discrete capacitor separate from DAC 21, rather than being incorporated in a CDAC. Internal reset switch 51 electrically grounds the left terminal of integrating capacitor C in essentially the same manner as described above in the embodiment of the invention shown in FIGS. 1 and 2. Isolation switch 53 couples the left terminal of integrating capacitor C to input conductor 12 in essentially the same manner as described above, and external reset switch 52 connects input conductor 12 to ground as described above.

Thus, the present invention avoids the above described problems associated with resistor 37 of FIG. 3 of U.S. Pat. No. 5,103,230 by replacing that resistor with a MOSFET isolation switch 53, which is controlled by the ISO signal on conductor 54. Also, switches 51 and 52 perform the function of electrically grounding both conductor 38 and conductor 12 during the above-mentioned CDAC "reset" operation.

While the invention has been described with reference to several particular embodiments thereof, those skilled in the art will be able to make the various modifications to the described embodiments of the invention without departing from the true spirit and scope of the invention. It is intended that all combinations of elements and steps which perform substantially the same function in substantially the same way to achieve the same result are within the scope of the invention.

What is claimed is:

1. A current integrating ADC, comprising in combination:
   (a) a comparator having a non-inverting input coupled to receive a ground voltage and an inverting input coupled to an input conductor, an analog input current flowing through the input conductor;
   (b) an integrating capacitor having a first terminal coupled to the input conductor;
   (c) a reset circuit coupled to the integrating capacitor and operative to reset the integrating capacitor before an integrating cycle;
   (d) a digital-to-analog converter having an output coupled to a second terminal of the integrating capacitor;
   (e) tracking means coupled to an output of the comparator for producing digital signals on digital inputs of the digital-to-analog converter to maintain the inverting input close to a virtual ground voltage, wherein the digital signals on the inputs of the digital-to-analog converter at the end of an integrating cycle represent the integral of the input current;
   (f) an isolation switch coupled between the first terminal and the input conductor; and
   (g) a control circuit operative to open the isolation switch during resetting of the integrating capacitor by the reset circuit.

2. A current integrating ADC, comprising in combination:
   (a) a comparator having a non-inverting input coupled to receive a ground voltage and an inverting input coupled to an input conductor, an analog input current flowing through the input conductor;
   (b) an integrating capacitor having a first terminal coupled to the input conductor;
   (c) a reset circuit coupled to the integrating capacitor and operative to reset the integrating capacitor before an integrating cycle;
   (d) a digital-to-analog converter having an output coupled to a second terminal of the integrating capacitor;
   (e) tracking means coupled to an output of the comparator for updating the digital-to-analog converter by producing digital signals on digital inputs of the digital-to-analog converter to maintain the inverting input close to a virtual ground voltage, wherein the digital signals on the inputs of the digital-to-analog converter at the end of an integrating cycle represent the integral of the input current;
   (f) an isolation switch coupled between the first terminal and the input conductor; and
   (g) a control circuit operative to open the isolation switch during voltage transients which occur on the first terminal of the integrating capacitor during the updating.

3. A current integrating analog-to-digital converter, comprising in combination:
   (a) a comparator having a non-inverting input coupled to receive a ground voltage and an inverting input coupled to an input conductor, an analog input current flowing through the input conductor;
   (b) a CDAC including a charge summing conductor coupled to the input conductor, the CDAC functioning as an integrating capacitor having a terminal coupled to the input conductor;
   (c) an isolation switch coupled between the charge summing conductor and the input conductor, and a control circuit operative to open the isolation switch during voltage transients which occur on the charge summing conductor during resetting of the CDAC; and
   (d) a tracking circuit coupled to an output of the comparator for producing digital signals on digital inputs of the 18 CDAC to maintain the inverting input close to a virtual ground voltage, wherein the digital signals on the inputs of the CDAC after an integrating cycle represent the input current.

4. A current integrating analog-to-digital converter, comprising in combination:
   (a) a comparator having a non-inverting input coupled to receive a ground voltage and an inverting input coupled to an input conductor, an analog input current flowing through the input conductor;
   (b) a CDAC including a charge summing conductor coupled to the input conductor, the CDAC functioning as an integrating capacitor having a terminal coupled to the input conductor;
   (c) an isolation switch coupled between the charge summing conductor and the input conductor, and a control circuit operative to open the isolation switch during voltage transients which occur on the charge summing conductor during updating of the CDAC; and
   (d) a tracking circuit coupled to an output of the comparator for producing digital signals on digital inputs of the CDAC to maintain the inverting input close to a virtual ground voltage, wherein the digital signals on the inputs of the CDAC after an integrating cycle represent the input current.

5. The current integrating analog-to-digital converter of claim 4 including a reset circuit connected to capacitors of the CDAC and operative to reset the CDAC and the integrating capacitor at the beginning of each integration cycle of the current integrating analog-to-digital converter.

6. The current integrating analog-to-digital converter of claim 5 including an internal reset switch connected to operatively couple the charge summing conductor to a first reference voltage in response to a first control signal.

7. The current integrating analog-to-digital converter of claim 6 including an external reset switch connected to operatively couple the input conductor to the first reference voltage in response to a second control signal.

8. The current integrating analog-to-digital converter of claim 7 wherein the control circuit is operative to produce a third control signal and the first and second control signals in response to a convert signal so that the internal and external reset switches are open during the updating of the CDAC.

9. The current integrating analog-to-digital converter of claim 8 wherein the control circuit is operative to establish the timing of the first, second, and third control signals to open the isolation switch during a reset cycle during which the CDAC is reset, to close the internal reset switch during a first part of the reset cycle, and to close the external reset switch during the reset cycle.

10. The current integrating analog-to-digital converter of claim 9 wherein the comparator has inverted and non-inverted outputs, the ADC including an autozero circuit coupling inverted and non-inverted outputs to corresponding inputs of the tracking circuit, the autozero circuit storing a voltage difference representative of an offset voltage of the comparator during the reset cycle to prevent the offset voltage from affecting operation of the tracking circuit.

11. The current integrating analog-to-digital converter of claim 10 including a plurality of latches each having an input coupled to a corresponding output of the tracking circuit, and a plurality of buffer circuits and switch driver circuits coupled in series between outputs of the latches and corresponding switches of the CDAC, the buffer circuits being operative to delay negative-going voltage contributions to CDAC switching transients produced on the charge summing conductor relative to positive-going voltage contributions to the CDAC switching transients produced on the charge summing conductor.

12. The current integrating analog-to-digital converter of claim 11 wherein the isolation switch includes a CMOS transmission gate coupled to the inverted and non-inverted outputs of a first differential switch driver.

13. The current integrating analog-to-digital converter of claim 12 wherein the internal reset switch includes a MOS transistor coupled to the inverted output of a second switch driver and the external reset switch includes a CMOS transmission gate coupled to inverted and non-inverted outputs of a third differential switch driver.

14. The current integrating analog-to-digital converter of claim 13 wherein the inverted outputs of the first and second differential switch drives produce voltage transitions tailored to charge injection into or out of the input conductor to compensate for charge injection into or out of the input charge summing conductor by voltage transitions of the inverted outputs thereof.

15. A method of isolating an analog input conductor from a first terminal of an integrating capacitor of a current integrating analog-to-digital converter of the kind including a digital-to-analog converter with an output coupled to a second terminal of the integrating capacitor, a comparator having an input coupled to the second terminal of the integrating capacitor and an output coupled to a tracking circuit which produces digital input signals for the digital-to-analog converter from the second terminal, the method comprising the steps of:
(a) coupling the first terminal to the analog input conductor by means of an isolation switch and opening the isolation switch in response to a first control signal during voltage transients produced on the first terminal during resetting of the integrating capacitor;
(b) coupling the first terminal to a reference voltage conductor by means of an internal switch and closing the internal switch in response to a second control signal during the resetting to dissipate the voltage transients; and
(c) closing the isolation switch and opening the internal switch after the resetting to electrically couple the analog input conductor to the first terminal during a tracking portion of an analog-to-digital conversion.

16. A method of isolating an analog input conductor from a first terminal of an integrating capacitor of a current integrating analog-to-digital converter of the kind including a digital-to-analog converter with an output coupled to a second terminal of the integrating capacitor, a comparator having an input coupled to the second terminal of the integrating capacitor and an output coupled to a tracking circuit which produces digital input signals for the digital-to-analog converter from the second terminal, the method comprising the steps of:
(a) coupling the first terminal to the analog input conductor by means of an isolation switch and opening the isolation switch in response to a first control signal during voltage transients produced on the first terminal during updating of the digital-to-analog converter; and
(b) closing the isolation switch after the voltage transients have settled to electrically couple the analog input conductor to the first terminal during a tracking portion of an analog-to-digital conversion.

17. A method of isolating an analog input conductor from a charge summing conductor of a current integrating analog-to-digital converter of the kind including a comparator having a non-inverting input coupled to receive a ground voltage and an inverting input coupled to the input conductor, a CDAC including the charge summing conductor, the CDAC functioning as an integrating capacitor, the method comprising the steps of:
(a) coupling the charge summing conductor to the input conductor by means of an isolation switch and opening the isolation switch in response to a first control signal produced by a control circuit during voltage transients produced on the charge summing conductor during resetting of the CDAC;
(b) coupling the charge summing conductor to a reference voltage conductor by means of an internal switch and closing the internal switch in response to a second control signal produced by the control circuit during the resetting to dissipate the voltage transients; and
(c) closing the isolation switch and opening the internal switch after the resetting to electrically couple the analog input conductor to the charge summing conductor during a tracking portion of an analog-to-digital conversion.

18. A method of isolating an analog input conductor from a charge summing conductor of a current integrating analog-to-digital converter of the kind including a comparator having a non-inverting input coupled to receive a ground voltage and an inverting input coupled to the input conductor, a CDAC including the charge summing conductor, the CDAC functioning as an integrating capacitor, the method comprising the steps of:
(a) coupling the charge summing conductor to the input conductor by means of an isolation switch and opening the isolation switch in response to a first control signal produced by a control circuit during voltage transients produced on the charge summing conductor during updating of the CDAC; and
(c) closing the isolation switch after the voltage transients have settled to electrically couple the analog input conductor to the charge summing conductor during a tracking portion of an analog-to-digital conversion.

* * * * *